United States Patent
McCaughan et al.

(10) Patent No.: US 11,329,211 B2
(45) Date of Patent: May 10, 2022

(54) CURRENT CROWDING IN THREE-TERMINAL SUPERCONDUCTING DEVICES AND RELATED METHODS

(71) Applicant: Massachusetts Institute of Technology, Cambridge, MA (US)

(72) Inventors: Adam N. McCaughan, Cambridge, MA (US); Karl K. Berggren, Arlington, MA (US); Qingyuan Zhao, Malden, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 56 days.

(21) Appl. No.: 16/992,458

(22) Filed: Aug. 13, 2020

(65) Prior Publication Data

US 2021/0028343 A1    Jan. 28, 2021

Related U.S. Application Data

(63) Continuation of application No. 15/563,158, filed as application No. PCT/US2016/025710 on Apr. 1, 2016, now Pat. No. 10,749,097.

(Continued)

(51) Int. Cl.
| | |
|---|---|
| *H01L 39/10* | (2006.01) |
| *G11C 11/44* | (2006.01) |
| *H01L 39/14* | (2006.01) |

(52) U.S. Cl.
CPC .............. *H01L 39/10* (2013.01); *G11C 11/44* (2013.01); *H01L 39/145* (2013.01)

(58) Field of Classification Search
CPC ......... H01L 21/76891; H01L 23/49888; H01L 23/53285; H01L 27/18; H01L 35/225;

(Continued)

(56) References Cited

U.S. PATENT DOCUMENTS

| 2,832,897 A | 4/1958 | Buck |
| 2,962,681 A | 11/1960 | Lentz |

(Continued)

FOREIGN PATENT DOCUMENTS

WO    WO 2016/171875 A1    10/2016

OTHER PUBLICATIONS

International Search Report and Written Opinion for International Application No. PCT/US2016/25710 dated Sep. 27, 2016.

(Continued)

*Primary Examiner* — Selim U Ahmed
*Assistant Examiner* — Evan G Clinton
(74) *Attorney, Agent, or Firm* — Wolf, Greenfield & Sacks, P.C.

(57) ABSTRACT

An active three-terminal superconducting device having an intersection region at which a hot spot may be controllably formed is described. The intersection region may exhibit current crowding in response to imbalances in current densities applied to channels connected to intersection region. The current crowding may form a hot spot, in which the superconducting device may exhibit a measurable resistance. In some cases, a three-terminal superconducting device may be configured to sense an amount of superconducting current flowing in a channel or loop without having to perturb the superconducting state or amount of current flowing in the channel. A three-terminal superconducting device may be used to read out a number of fluxons stored in a superconducting memory element.

17 Claims, 10 Drawing Sheets

Related U.S. Application Data

(60) Provisional application No. 62/142,787, filed on Apr. 3, 2015.

(58) Field of Classification Search
CPC ........... H01L 39/00–2496; H01L 39/06; H01L 39/10; H01L 39/145–146
See application file for complete search history.

(56) References Cited

U.S. PATENT DOCUMENTS

| | | | |
|---|---|---|---|
| 3,283,282 | A | 11/1966 | Rosenberg et al. |
| 4,028,714 | A | 6/1977 | Henkels |
| 4,334,158 | A | 6/1982 | Faris |
| 4,371,796 | A | 2/1983 | Takada |
| 4,496,854 | A | 1/1985 | Chi et al. |
| 4,526,858 | A | 7/1985 | Luckens et al. |
| 5,051,627 | A | 9/1991 | Schneier et al. |
| 5,258,934 | A | 11/1993 | Agranat et al. |
| 5,332,722 | A | 7/1994 | Fujihira |
| 5,345,114 | A | 9/1994 | Ma et al. |
| 5,455,519 | A | 10/1995 | Ohori |
| 5,481,119 | A | 1/1996 | Higashino et al. |
| 5,831,278 | A | 11/1998 | Berkowitz |
| 6,154,044 | A | 11/2000 | Herr |
| 6,310,488 | B1 | 10/2001 | Hasegawa et al. |
| 6,549,059 | B1 | 4/2003 | Johnson |
| 6,710,343 | B2 | 3/2004 | Wood et al. |
| 6,717,451 | B1 | 4/2004 | Klein et al. |
| 6,728,131 | B2 | 4/2004 | Ustinov |
| 6,734,699 | B1 | 5/2004 | Herr et al. |
| 6,919,579 | B2 * | 7/2005 | Amin .................... B82Y 10/00 257/31 |
| 6,979,836 | B2 | 12/2005 | Zagoskin et al. |
| 7,283,339 | B2 | 10/2007 | Tekletsadik |
| 7,468,630 | B2 | 2/2008 | Inamdar et al. |
| 7,365,271 | B2 | 4/2008 | Knoll et al. |
| 7,728,781 | B2 | 6/2010 | Youn |
| 7,786,024 | B2 | 8/2010 | Stumbo et al. |
| 7,786,748 | B1 | 8/2010 | Herr |
| 7,879,763 | B2 | 2/2011 | Selvamanickam et al. |
| 8,571,614 | B1 | 10/2013 | Mukhanov et al. |
| 8,856,055 | B2 | 10/2014 | Brezzo et al. |
| 9,443,580 | B2 | 9/2016 | Muralimanohar et al. |
| 9,509,315 | B2 | 11/2016 | McCaughan et al. |
| 9,520,180 | B1 | 12/2016 | Mukhanov et al. |
| 9,747,968 | B2 | 8/2017 | Ohki et al. |
| 9,780,765 | B2 | 10/2017 | Naaman et al. |
| 9,887,000 | B1 | 2/2018 | Mukhanov et al. |
| 10,171,086 | B2 | 1/2019 | McCaughan et al. |
| 10,749,097 | B2 | 8/2020 | McCaughan et al. |
| 2014/0113828 | A1 | 4/2014 | Gilbert et al. |
| 2016/0028402 | A1 | 1/2016 | McCaughan et al. |
| 2016/0028403 | A1 * | 1/2016 | McCaughan ......... H01L 39/125 326/7 |
| 2017/0186933 | A1 | 6/2017 | Sunter et al. |
| 2018/0090661 | A1 | 3/2018 | McCaughan et al. |
| 2020/0027502 | A1 | 1/2020 | Berggren et al. |

OTHER PUBLICATIONS

International Preliminary Report on Patentability for International Application No. PCT/US2019/016467 dated Aug. 20, 2020.
International Search Report and Written Opinion for International Application No. PCT/US2019/016467 dated Jun. 27, 2019.
Invitation to Pay Additional Fees dated Apr. 9, 2019 in connection with International Application No. PCT/US2019/016467.
International Search Report and Written Opinion for International Application No. PCT/US2014/023640 dated Nov. 20, 2014.
International Preliminary Report on Patentability for International Application No. PCT/US2014/023640 dated Sep. 24, 2015.
International Search Report and Written Opinion for International Application No. PCT/US2014/023664 dated Nov. 20, 2014.
International Preliminary Report on Patentability for International Application No. PCT/US2014/023664 dated Sep. 24, 2015.
Akazaki et al., A Josephson field effect transistor using an InAs-inserted-channel In0.52A10.48As/In0.53Ga0.47As inverted modulation-doped structure. Appl Phys Lett. Jan. 15, 1996;68(3):418-20.
Annunziata et al., Reset dynamics and latching in niobium superconducting nanowire single-photon detectors. J Appl Phys. 2010;108(8):084507(1-7).
Annunziata, Single-Photon Detection, Kinetic Inductance, and Non-Equilibrium Dynamics in Niobium and Niobium Nitride Superconducting Nanowires. Yale PhD Thesis. May 2010. http://proberlab.yale.edu/sites/default/files/files/Annunziata_Thesis.pdf. 224 pages.
Aprili, The nanoSQUID makes its debut. Nature Nanotechnology. Oct. 2006;1(1):15-16.
Buck, The cryotron—A superconductive computer component. Proc IRE. Apr. 1956;44:482-93.
Burr et al., Neuromorphic computing using non-volatile memory. Advances in Physics: X. 2017; X, 2:1, 89-124.
Chen et al., Technology-design co-optimization of resistive cross-point array for accelerating learning algorithms on chip. 2015 Design, Automation & Test in Europe Conference & Exhibition (DATE). 2015; p. 854-859.
Clem et al., Geometry-dependent critical currents in superconducting nanocircuits. Phys Rev B. Nov. 2011;84(17):174510 (1-27).
Collobert et al., Natural language processing (almost) from scratch. Journal of Machine Learning Research. 2011;12(7):2493-2537.
Doda et al., Characteristics of superconducting flux flow transistors under irradiation of femtosecond laser pulses. Physica C. 2003;392-396:1504-08.
Ejrnaes et al., Characterization of superconducting pulse discriminators based on parallel NbN nanostriplines. Supercond Sci Technol. Jan. 20, 2011;24(3):035018(1-6).
Gokmen et al., Acceleration of deep neural network training with resistive cross-point devices: Design Considerations. Frontiers in Neuroscience. Jul. 21, 2016;10:333, 13 pages.
Gokmen et al., Training deep convolutional neural networks with resistive cross-point devices. Frontiers in Neuroscience. Oct. 2017; 11:538; 13 pages.
Gray, A superconducting transistor. Appl Phys Lett. Mar. 15, 1978;32(6):392-5. doi. 10/1063/1.90066.
Gurevich et al., Self-heating in normal metals and superconductors. Rev Mod Phys. Oct. 1987;59(4):941-99.
Hohenwarter, Superconducting high TC thin film vortex-flow transistor. Research Report. AD-A235 025. Aug. 1, 1990 to Mar. 31, 1991.available online at www.dtic.mil/dtic/tr/fulltext/u2/a235025.pdf. 29 pages.
Hortensius et al., Critical-current reduction in thin superconducting wires due to current crowding. Appl. Phys Lett. 2012;100:182602(1-4). Epub May 3, 2012.
Hosoya et al., quantum flux parametron: A single quantum flux device for Josephson supercomputer. IEEE Trans Appl Supercond. Jun. 1991;1(2):77-89.
Kerman et al., Electrothermal feedback in superconducting nanowire single-photon detectors. The American Physical Society. Physical Review B. 2009;79(10):100509; 4 pages.
Kerman et al., Electrothermal feedback in superconducting nanowire single-photon detectors. Phys Rev B. 2009;79:100509R(1-4).
Kim et al., A functional hybrid memristor crossbar-array/CMOS system for data storage and neuromorphic applications. Nano Letters. American Chemical Society. 2012;12(1):389-395.
Klapwijk, Proximity effect from an Andreev perspective. J Supercond: Incorp Novel Magnetism. Oct. 2004;17(5):593-611.
Ko et al., Characteristics of a single-channel superconducting flux flow transistor fabricated by an AFM modification technique. Physica C. 2007;466:16-22.
Krizhevsky et al., Imagenet classification with deep convolutional neural networks. NIPS. 2012; 60(6):84-90.
Kurter et al., Microscopic examination of hot spots giving rise to nonlinearity in superconducting resonators. Phys. Rev. B. Sep. 12, 2011;84(10):104515(1-5).
Lecun et al., Deep learning. Nature. May 28, 2015; 521:436-444.
Lee et al., Superconducting nanotransistor based digital logic gates. Nanotechnology. Feb. 2003;14(2):188-91. Epub Jan. 16, 2003.

(56) References Cited

OTHER PUBLICATIONS

Likharev, Superconductor digital electronics. Physica C. Nov. 20, 2012;482:6-18. Epub Jun. 15, 2012.

Marsili et al., Detecting single infrared photons with 93% system efficiency. Nat Photonics. Mar. 2013;7:210-14. Epub Feb. 24, 2013.

Matisoo, The tunneling cryotron—A superconductive logic element based on electron tunneling. Proceedings of the IEEE. Feb. 1967;55(2):172-80.

McCaughan et al., A superconducting-nanowire three-terminal electrothermal device. Nano Letters. 2014; 14(10):5748-5753.

McCaughan et al., nanoSQUID operation using kinetic rather than magnetic induction. Scientific Reports. 2016;6:28095; 5 pages.

McCaughan et al., Using geometry to sense current. Nano Letters. 2016;16(12):7626-7631.

Morpugo et al., Hot electron tunable supercurrent. Appl Phys Lett. Feb. 23, 1998; 72(8):966-8.

Najafabadi et al., Deep learning applications and challenges in big data analytics. Journal of Big Data. 2015; 2(1): 21 pages.

Najafi et al., Timing performance of 30-nm-wide superconducting nanowire avalanche photodetectors. Appl Phys Lett. 2012;100:152602(1-4). Suppl Mater. 5 pages.

Pagano et al., Josephson junctions. Supercond Sci Technol. Dec. 1997;10(12):904-8.

Pagano et al., Nano-strip three-terminal superconducting device for cryogenic detector readout. IEEE Trans on Appl Supercond. Jun. 2011; 21(3):717-20.

Peterson et al., Self-heating hotspot effects in HTS thin films. IEEE Trans Appl Supercond. 1995;5(2):1436-9. Epub Jun. 1, 1995.

Prezioso et al., Training and operation of an integrated neuromorphic network based on metal-oxide memristors. Nature. 2015;521,7550:61-64.

Prober, Superconducting terahertz mixer using a transition-edge microbolometer. Appl Phys Lett. Apr. 26, 1993;62(17):2119-21.

Quaranta et al., Superconductive three-terminal amplifier/discriminator. IEEE transactions on applied superconductivity. Jun. 30, 2009;19(3):367-70.

Rothwarf et al., Measurement of recombination lifetimes in superconductors. Phys Rev Lett. Jul. 1967;19(1):27-30.

Semenov et al., Analysis of the nonequilibrium photoresponse of superconducting films to pulsed radiation by use of a two-temperature model. Phys Rev B. Jul. 1, 1995;52(1):581-90.

Semenov et al., Quantum detection by current carrying superconducting film. Phys C: Supercond. Apr. 15, 2001;351(4):349-56.

Skocpol et al., Self-heating hotspots in superconducting thin-film microbridges. J Appl Phys. Sep. 1974;45(9):4054-66.

Steinbuch, Die lernmatrix. Kybernetik, 1961;1(1):36-45.

Yang et al., Modeling the electrical and thermal response of superconducting nanowire single-photon detectors. IEEE Trans on Appl Supercond. Jun. 2007;17(2):581-5.

Zhao et al., A compact superconducting nanowire memory element operated by nanowire cryotrons. unpublished. MIT (Found online—published Feb. 7, 2018); 20 pages.

\* cited by examiner

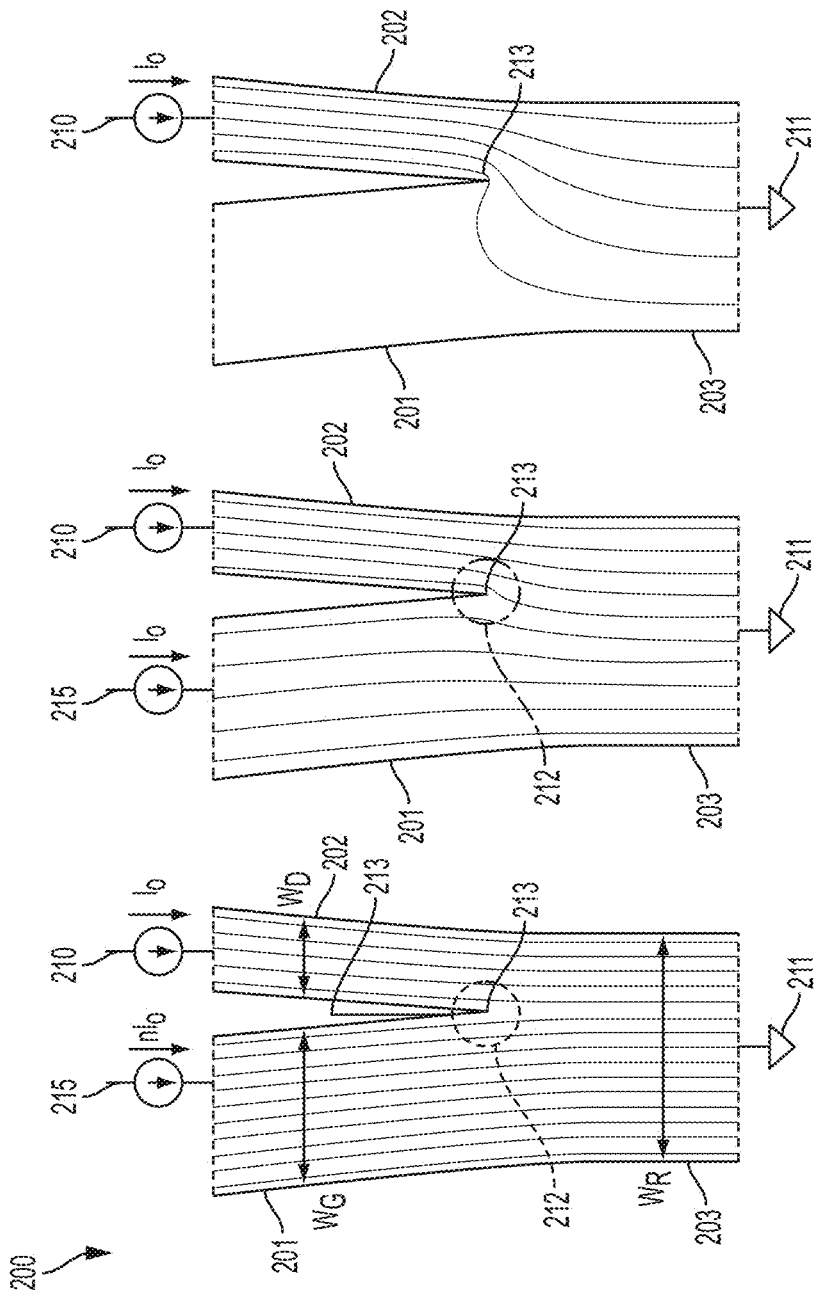

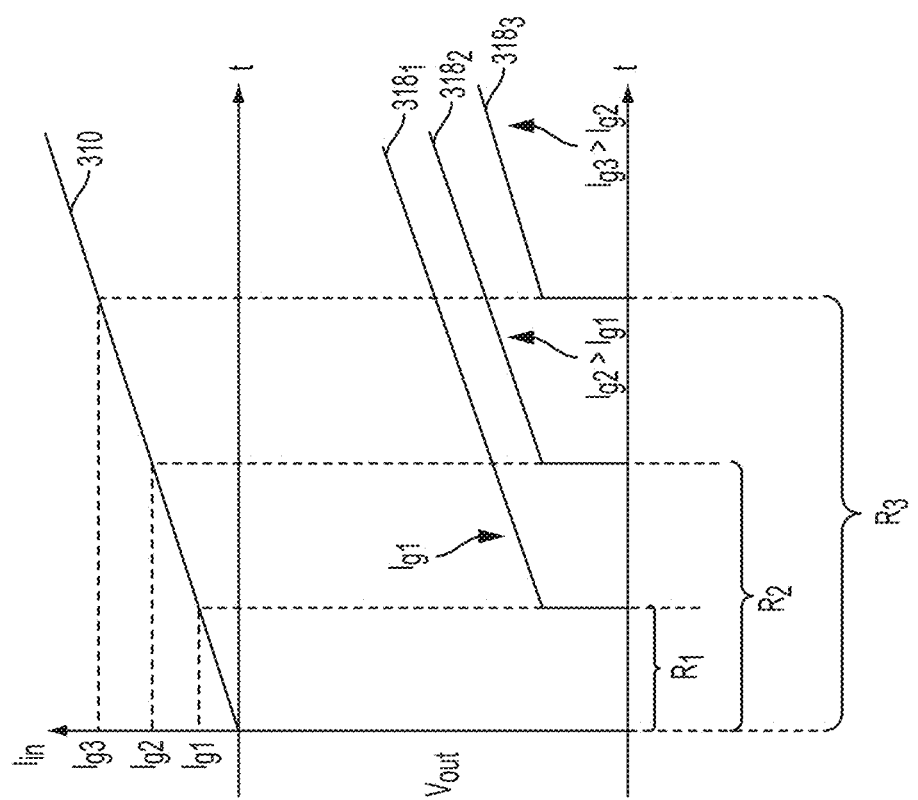
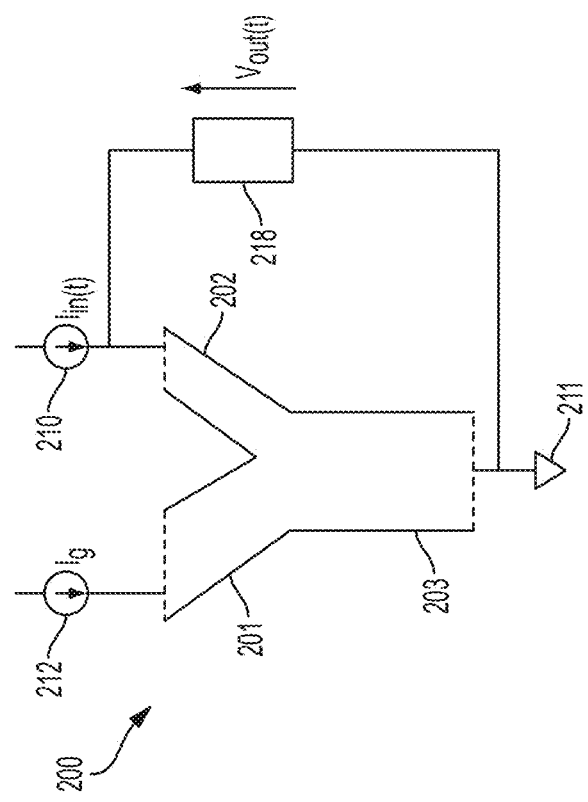
FIG. 3B
FIG. 3A

CURRENT CROWDING IN THREE-TERMINAL SUPERCONDUCTING DEVICES AND RELATED METHODS

RELATED APPLICATIONS

This Application is a continuation claiming the benefit under 35 U.S.C. § 120 of U.S. patent application Ser. No. 15/563,158, filed on Sep. 29, 2017, and entitled "CURRENT CROWDING IN THREE-TERMINAL SUPERCONDUCTING DEVICES AND RELATED METHODS," which is a national stage application under 35 U.S.C. § 371 of International Patent Application Serial No. PCT/US2016/025710, filed on Apr. 1, 2016, entitled "CURRENT CROWDING IN THREE-TERMINAL SUPERCONDUCTING DEVICES AND RELATED METHODS," which claims priority under 35 U.S.C. § 119(e) to U.S. Provisional Application Ser. No. 62/142,787, entitled "CURRENT CROWDING CRYOTRON" filed on Apr. 3, 2015, each of which is herein incorporated by reference in its entirety.

FEDERALLY SPONSORED RESEARCH

This invention was made with Government support under Contract No. W911NF-14-C-0089 awarded by the Army Research Office, and Grant No. FA9550-14-1-0052 awarded by the Air Force Office of Scientific Research. The Government has certain rights in the invention.

BACKGROUND

Superconducting switches for various electrical circuit applications have been studied, and several different devices have been developed. Some superconducting switches, such as the cryotron developed by Dudley Buck in the 1950's and the superconducting flux-flow transistor (SFFT) developed in more recent years, rely on an externally-applied magnetic field to quench superconductivity between current-carrying terminals of the device. (See e.g., U.S. Pat. No. 2,832,897; G. K. Hohenwarter, "Superconducting High TC Thin Film Vortex-Flow Transistor," Sponsored Research Report (1991) available at www.dtic.mil/dtic/tr/fulltext/u2/a235025.pdf.) Because these devices switched a large region of the device between a "superconducting" state and a "normal" state, the devices tend to exhibit slow switching speeds, e.g., on the order of 10's of microseconds.

In the late 1960's, alternative approaches to fabricating superconducting switches incorporated Josephson junctions into a multi-layer integrated device. (See e.g., J. Matisoo, "The Tunneling Cryotron—A Superconducting Logic Element Based on Electron Tunneling," Proc. IEEE, Vol. 55, No. 2, February 1967, p. 172.) The Josephson junction devices include a tunnel junction at a gate region of the device. The junction can be switched between a superconducting state and a normal tunneling state by the application of a current pulse that exceeds a critical current level at the Josephson junction. Because the junction volume is small, the device can be switched quickly, e.g., at switching times of the order of 1 picosecond. However, Josephson-junction-based devices have a number of limitations including: (1) sensitivity to magnetic fields, (2) limited gain, (3) inability to drive large impedances, and (4) difficulty in controlling the junction critical current (which depends sensitively on sub-Angstrom-scale thickness variation of the tunneling barrier). Additionally, fabrication of the device requires multi-layer and multi-material processing, as well as precise control of the tunneling barrier's thickness.

Recently, superconducting sensors and amplifiers have been developed for applications such as single-photon detection. (See, O. Quaranta et al., "Superconducting Three-Terminal Amplifier/Discriminator," IEEE Trans. Appl. Supercond., Vol. 19, No. 3 (2009) p. 367.)

BRIEF SUMMARY

A three-terminal superconducting device having an intersection region and at least three channels may be configured, in some embodiments, to control current flow at an output port responsive to current applied to a control or gate channel. In other embodiments, a three-terminal superconducting device may be configured to sense an amount of current flowing in a superconducting channel or current loop without perturbing the superconducting state or amount of current in the sensed channel. A three-terminal superconducting device may be activated by applying imbalanced current densities to two channels of the device that merge at the intersection region. When a sufficient imbalance is applied, either a hot spot (a region in a normal state having measurable resistance) will form in a second of the two channels or superconductivity will be suppressed in the second channel and flux will flow across the second channel. In both cases, a voltage may appear at a terminal connected to the second channel. The appearance of the hot spot may impede current flow in the second channel and divert current to an output port of the device, according to some embodiments. In other embodiments, the appearance of the hot spot indicates a level of current flowing in the first superconducting channel of the two channels, without perturbing the superconducting state or amount of current in the first channel. A three-terminal superconducting device may be used as a transistor or current switch in some embodiments, that can have a dynamically-adjustable threshold value. In some embodiments, a three-terminal superconducting device may be used as a read-out element for a superconducting memory element.

Some embodiments relate to a device comprising a drain channel and a reference channel. The reference channel may be connected to the drain channel. The device may further comprise a conductive loop formed from a material that supports superconductivity. The conductive loop may be connected to an intersection region between the drain channel and the reference channel.

Some embodiments relate to a method for sensing an amount of current in a first superconducting channel. The method may comprise varying an amount of current applied to a second superconducting channel that intersects with the first superconducting channel and detecting a voltage on the second superconducting channel.

Some embodiments relate to a superconducting, three-terminal device that includes a gate channel, a drain channel, and a reference channel formed from a material that supports superconductivity. The drain channel may intersect the gate channel at an angle. In some aspects, a reduction in current in the gate channel, when the device is operated in a superconducting mode, may increase current crowding in an intersection region of the gate channel and drain channel and cause the formation of a region of measureable resistance in the drain channel.

Some embodiments relate to a method of operating a three-terminal device having a gate channel, a drain channel, and a reference channel. The drain channel may intersect the gate channel in an intersection region. The method may comprise placing the three-terminal device in a superconducting state, such that the gate, the drain and the reference channel are superconducting; increasing a current crowding in the intersection region by reducing a gate current flowing through the gate channel; and forming a region of measurable resistance in the drain channel.

BRIEF DESCRIPTION OF DRAWINGS

The skilled artisan will understand that the figures, described herein, are for illustration purposes only. It is to be understood that in some instances various aspects of the invention may be shown exaggerated or enlarged to facilitate an understanding of the invention. In the drawings, like reference characters generally refer to like features, functionally similar and/or structurally similar elements throughout the various figures. The drawings are not necessarily to scale, emphasis instead being placed upon illustrating the principles of the teachings. The drawings are not intended to limit the scope of the present teachings in any way.

FIG. 2A illustrates a three-terminal device shown in a first operating state, according to some embodiments;

FIG. 2B illustrates the three-terminal device of FIG. 2A shown in a second operating state, according to some embodiments;

FIG. 2C illustrates the three-terminal device of FIG. 2A shown in a third operating state, according to some embodiments;

FIG. 3A illustrates the three-terminal device of FIG. 2A having an impedance connected thereto, according to some embodiments;

FIG. 3B depicts two graphs, where the first graph illustrates a drain current as a function of time, and the second graph illustrates a measured voltage as a function of time, according to some embodiments;

DETAILED DESCRIPTION

Figure 1:
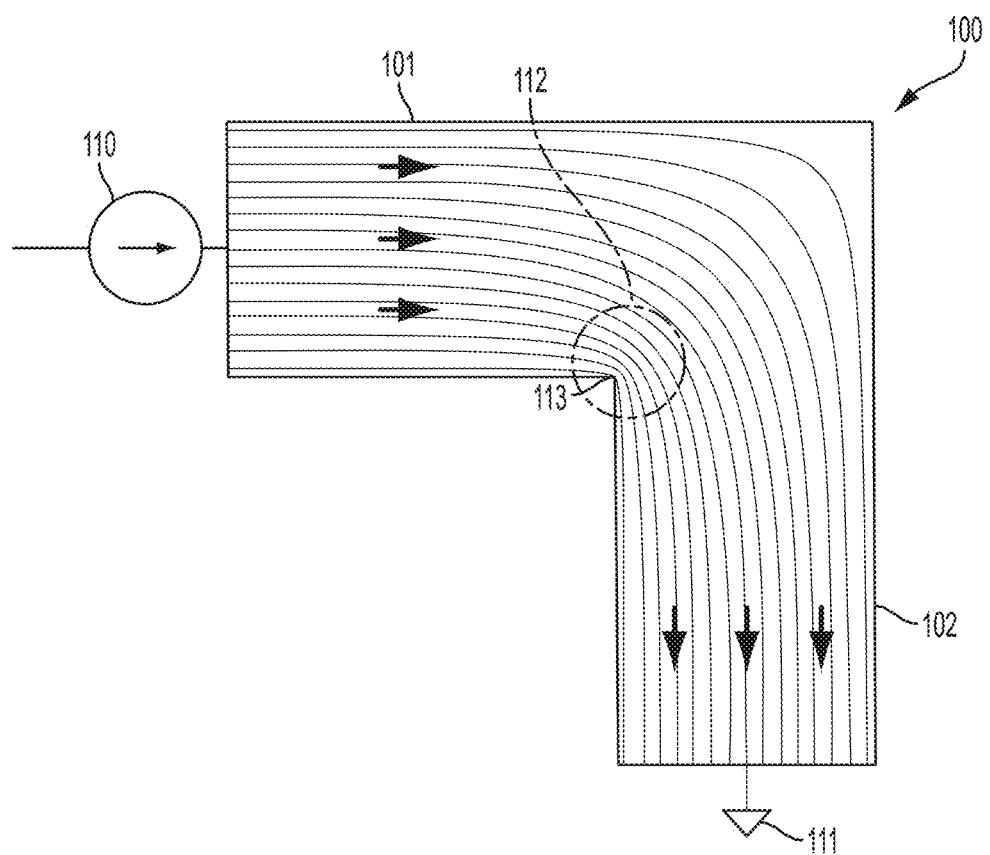
FIG. 1 illustrates a superconducting device having an abrupt corner.

The inventors have recognized and appreciated that conventional methods for sensing currents flowing in a superconducting channel involve magnetically coupling the current flowing in the channel to an external loop or perturbing the superconducting state of the channel. Magnetically coupling to external loops may be mechanically cumbersome in some circumstances, as additional superconducting components and/or circuits may be needed. On the other hand, disrupting the superconducting state may cause the alteration, though unintentional, of the quantity to be measured, such as the number of fluxons in a superconducting state. Ideally, it is desirable to sense a current flowing in superconducting channel without perturbing the current and without having to resort to complex magnetically coupling structures. The phrases "superconducting devices" and "superconducting channels" are used to refer to devices and channels, respectively, formed from at least one superconducting material.

Aspects of the present application provide a three-terminal superconducting device that may be used in different ways in various superconducting circuits. According to some embodiments, a three-terminal superconducting device may be used to sense the current flowing in a first superconducting channel by detecting the critical current of a second superconducting channel without perturbing the state of the current being sensed in the first channel. The phrase "critical current" is used to refer to the maximum current that can flow in a superconducting channel without breaking down or suppressing superconductivity and either forming regions of measurable resistance or allowing flux to flow across the broken-down region (thus creating a measureable voltage state). If the current in the second channel exceeds the critical current, a region of measureable resistance may form and the device may depart, at least in part, from a superconducting state. The detection of the onset of a voltage state can be used to obtain information about current flowing in the first superconducting channel, without perturbing the superconducting state of the first channel. The phrase "voltage state" is used to refer to a condition of the three-terminal device where a measurable voltage appears across at least a portion of a channel of the device.

In other embodiments, a three-terminal superconducting device may be configured to operate in a transistor mode, where current flowing in a first superconducting channel (e.g., a gate channel) may be altered to control an amount of current flowing through an output port of the transistor. A second channel may change between superconducting and normal states responsive to changes in current in the gate channel or in the second channel. An advantage of the three-terminal superconducting device configured as a transistor is that the device may not latch up when the second channel is in a normal state. For example, the current in the gate channel and second channel need not be reduced to a near zero value to resume superconducting operation. This can allow more rapid operation of a superconducting transistor than for a different version of a superconducting transistor described in U.S. patent application Ser. No. 14/775,118, titled "Superconducting Three-Terminal Device and Logic Gates," filed Sep. 11, 2015, which is incorporated herein by reference.

The inventors have further recognized and appreciated that in yet additional embodiments, a three-terminal superconducting device described herein may be used to sense currents circulating in a superconducting loop without perturbing the superconducting state of the loop. Because the loop can retain its superconducting state even when its current is sensed, the inventors have recognized and appreciated that a superconducting three-terminal device may be combined with a superconducting loop to form a readable memory element that may be read out multiple times without altering its value.

The aspects and embodiments described above, as well as additional aspects and embodiments, are described in further detail below. These aspects and/or embodiments may be used individually or in any suitable combination, as the application is not limited in this respect.

By way of introduction, FIG. 1 illustrates a superconducting device 100 having an abrupt corner 113 at which current crowding occurs. The phrase "current crowding" is used to refer to a phenomenon whereby the current density of a region is significantly larger (e.g., by at least 25%) than the current density in the regions surrounding such region. A superconducting device 100 may be made from a superconducting material, such as niobium (Nb) or Niobium Nitride (NbN), for example. A superconducting device 100 may comprise a first channel 101 that bends abruptly to a second channel 102, e.g., bends at a 90° angle. The first channel 101 may be connected to current source 110 that provides an electric current to the channel 110. The second channel 102 may be connected to a reference terminal 111, such as a ground terminal, which may be held at a fixed potential. When the current source 110 outputs an electric current, the superconducting device 100 may be configured to support an electric current that flows toward, or from, reference terminal 111. A superconducting device 100 may be placed in a superconducting state by reducing its temperature below its critical temperature. For example, the temperature may be reduced by placing the superconducting device 100 into an environment cooled by liquid helium.

When a current flows in the device 100, a region 112 of the device (indicated by the dark shading in the drawing at the abrupt corner 113) may exhibit current crowding. Whether current crowding occurs and an amount of current crowding can depend on the geometry of the device. In the drawing, flow lines are shown to represent the current density distribution, such that the closer the lines to one another, the higher the local current density. In a region of current crowding, the current density may be significantly greater (e.g., by at least 25%) than the current density exhibited elsewhere. In FIG. 1, the increase in current density is over a factor of 2 at the abrupt corner 113. When current crowding occurs at a region 112, the region may exhibit a temperature increase. If the local temperature in the region exceeds the critical temperature for superconductivity, the region 112 may, at least in part, depart from the superconducting state and may exhibit a measureable resistance. In some instances, depending on the amount of applied current, the appearance of measureable resistance can create heat which may elevate adjacent regions of the channel above the critical temperature and thereby propagate a resistive plug across most or all of the channel width. A resulting resistance of the drain channel may be between approximately 10 ohms and approximately 1000 ohms. The appearance of a measureable resistance can result in a measurable voltage drop across the device (e.g., across a region in which current crowding has elevated the temperature above the critical temperature). By measuring the voltage, information about the superconducting state and/or current flowing in the channel can be obtained.

In some embodiments, a three-terminal superconducting device may comprise a sharp intersection region formed between two channels. By way of example and not limitation, the three-terminal device may form a Y-shaped structure with two input channels and one output channel. When the current densities of the two input channels are unbalanced, current crowding may form in the intersection region of the two input channels. If the imbalance in the current densities is significant, the current crowding may lead the intersection region to experience suppression of the superconducting state in one of the channels. Because of this suppression, a voltage state may be produced in the channel, either in the form of a hotspot or a in the form of flux flowing across the channel. The phrase "hot spot" is used to refer to a region in a superconducting structure for which the temperature at the hot spot exceeds the critical temperature of the superconducting material. In some embodiments, by detecting a voltage state (e.g., detecting a voltage due to an increased resistance in a first input channel), an amount of current flowing in another superconducting channel of the three-terminal device (e.g., a second input channel) may be detected without disrupting the superconducting current flow in the other channel.

The inventors have recognized and appreciated that current crowding can be used in a three-terminal superconducting device to control current flowing in a superconducting channel, or to detect a current flowing in a superconducting channel without perturbing the superconducting state or amount of current in the sensed channel. FIG. 2A illustrates just one embodiment of a three-terminal superconducting device 200 that may use current crowding to sense or control current in a channel, though the invention is not limited to only the depicted geometry.

According to some embodiments, a three-terminal superconducting device 200 may comprise a gate channel 201 and a drain channel 202 that connect to a reference channel 203 at an intersection region. A three-terminal superconducting device 200 may be made from a superconducting material, such as niobium (Nb), niobium nitride (NbN), niobium monoxide (NbO), tantalum (Ta), technetium (Tc), titanium nitride (TiN), niobium titanium nitride (NbTiN), yttrium barium copper oxide (YBCO), etc. or a suitable combination thereof. In some embodiments, a three-terminal superconducting device 200 may be formed from a single superconducting material that may be deposited on a substrate in a single layer. The layer may be patterned, for example, using microfabrication techniques (e.g., using electron-beam lithography, photolithography, deposition and/or etching processes), to obtain a device like that illustrated in FIG. 2A. In other embodiments, gate channel 201 and drain channel 202 may be formed from different superconducting materials deposited in different layers.

As illustrated in FIG. 2A, gate channel 201 and drain channel 202 may be angled with respect to one another. The angle formed between gate channel 201 and drain channel 202 may be between 90° and 0° in some embodiments, between 70° and 0° in some embodiments, between 30° and 0° in some embodiments, between 10° and 0° in some embodiments, or between 5° and 0° in some embodiments, though other angles may be implemented in some embodiments. In some embodiments, there may be an sharp feature 213 (e.g., an abrupt or sharp turn in a channel wall) between a gate channel 201 and a drain channel 202 at an intersection region 212. However, in some embodiments, a feature at an intersection region may have some rounding at the submicrometer scale, as depicted in FIG. 2E, for example. A rounded feature 273 may have a radius of curvature that is less than approximately ten times the coherence length $\xi$ associated with the material from which the gate channel is formed in some embodiments, less than approximately five times the coherence length $\xi$, less than approximately three times the coherence length $\xi$, though other values of the radius of curvature are also possible in some embodiments. For example, the superconducting coherence length in Nb is about 38 nm and the superconducting coherence length in NbN is about 5 nm. The superconducting coherence length relates to a minimum spatial extent over which a superconductor can transition from a superconducting state to a normal state.

In some embodiments, an abrupt feature at an intersection region may be rounded due to the limited resolution of the fabrication process used to pattern and form the three-terminal device.

Referring back to FIG. 2A, a gate channel 201 may have a width $W_G$ that is greater than the superconducting coherence length ξ associated with the material from which the gate channel is formed. A width $W_G$ of a gate channel may be between 50 nm and 800 nm in some embodiments, between 100 nm and 300 nm in some embodiments, between 150 nm and 250 nm in some embodiments, though larger values may be used in some cases and for different materials.

A drain channel 202 may have a width $W_D$ that is also greater than the superconducting coherence length associated with the material from which the drain channel is formed. A width $W_D$ of the drain channel may be between 50 nm and 800 nm in some embodiments, between 50 nm and 300 nm in some embodiments, between 50 nm and 150 nm in some embodiments, though larger values may be used in some cases and for different materials. In some embodiments, $W_D$ and $W_G$ may be less than the effective penetration depth $\lambda_{eff}$ of the material from which the drain channel and the gate channel are formed, respectively. The effective penetration depth may be defined as $$\lambda_{eff} = \lambda_L^2 / t$$

where $\lambda_L$ is the superconducting penetration depth, sometimes referred to as the "London penetration depth", which relates to the distance over which a magnetic field penetrates into a superconductor and becomes equal to $e^{-1}$ times that of the magnetic field at the surface of the superconductor, and t is the thickness of the three-terminal superconducting device 200.

In some embodiments, the gate channel may be wider than the drain channel, and $W_G$ may have a ratio to $W_D$ that is between 1:1 and 8:1 in some embodiments, between 1:1 and 5:1 in some embodiments, between 1:1 and 3:1 in some embodiments, or between 1:1 and 2:1 in some embodiments, though other ratios may be implemented in some embodiments. In some embodiments, a reference channel 203 may have a width $W_R$ that is approximately equal to the sum of $W_G$ and $W_D$. In some embodiments, a reference channel 203 may have a width $W_R$ that is less than the sum of $W_G$ and $W_D$. Reference channel 203 may be connected to a reference terminal 211 which may be held at a fixed potential, such as a ground terminal.

A three-terminal superconducting device 200 may have a thickness t that is less than the superconducting penetration depth associated with the superconducting material(s) from which the device is formed. A three-terminal device 200 may have a thickness that is between 5 nm and 50 nm in some embodiments, between 5 nm and 20 nm in some embodiments, between 6 nm and 10 nm in some embodiments, though larger values may be used in some cases and for different materials.

A superconducting device 200 may be placed in a superconducting state by reducing its temperature below its critical temperature. For example, the temperature may be reduced by placing the superconducting device 100 into an environment cooled by liquid helium.

According to some embodiments, a drain channel 202 may be connected in series to a first current source 210 that is configured to output an electric current equal to $I_0$. A gate channel 201 may be connected in series to a second current source 215 that may be a controllable current source, according to some embodiments. For example, the second current source may be operated to vary the current in the gate channel 201 between 0 and an electric current equal to $nI_0$, where n may be equal to the ratio $W_G/W_D$. When $n=W_G/W_D$, the current densities supported by the two channels may be equal to one another, as depicted by the flow lines in FIG. 2A. Because the current densities of the channels are equal, there may be no current crowding at the sharp feature 213 in the intersection region 212.

FIG. 2B illustrate a three-terminal superconducting source 200 having a gate channel 201 connected in series to a current source 215, which, in this instance, may be configured to output an electric current equal to $I_0$. Compared to the instance illustrated in FIG. 2A, the current density in the gate channel is lower and the current density in the drain channel is unvaried. As illustrated in FIG. 2B, the imbalance in the current densities is such that, at the sharp feature 213 of the intersection region 212, a current having a transverse component with respect to a central axis of the drain channel, may arise. The transverse current may occur to produce an approximately constant current density within the reference channel 203, at a distance downstream from intersection region 212 (e.g., a distance greater than about 50 nm). Due to the transverse current component, current crowding may occur in the intersection region 212 near the sharp feature 213, compared to the instance of FIG. 2A. The resulting increase in current density may cause a local suppression of superconductivity and may, in some embodiments, induce a voltage state.

In the instance illustrated in FIG. 2C, the current provided to the gate channel may reduce to zero or a value of current density that is significantly less than the value of current density in the drain channel. Because of the significant imbalance (e.g., at least 50%) in the current densities, a greater amount of current crowding may occur in the intersection region 212 than for the case illustrated in FIG. 2B. As a result, the local current density may exceed the critical current density of the superconducting material, so that superconductivity may break down in the drain channel. When superconductivity breaks down in the drain channel, the drain channel may exhibit either a flow of flux across it or an appreciable resistance (e.g., at least 10 ohms). As a result, a voltage may appear across the intersection region. In some embodiments, the appearance of resistance in the drain channel can divert current from the drain channel to an output port (not shown) connected to the drain channel above the intersection region 212. In this manner, current to the output port can be switched on and off by controlling current applied to the gate channel.

Figure 2D:
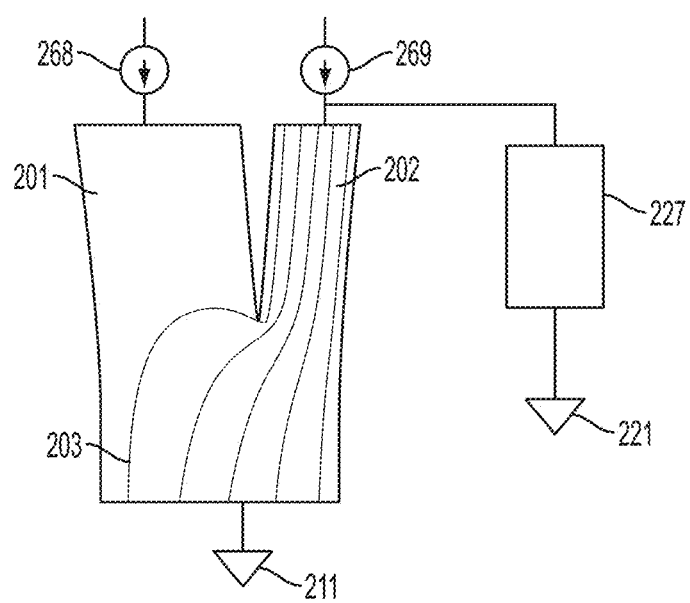
FIG. 2D illustrates the three-terminal device that includes an output port, according to some embodiments.
Figure 2E:
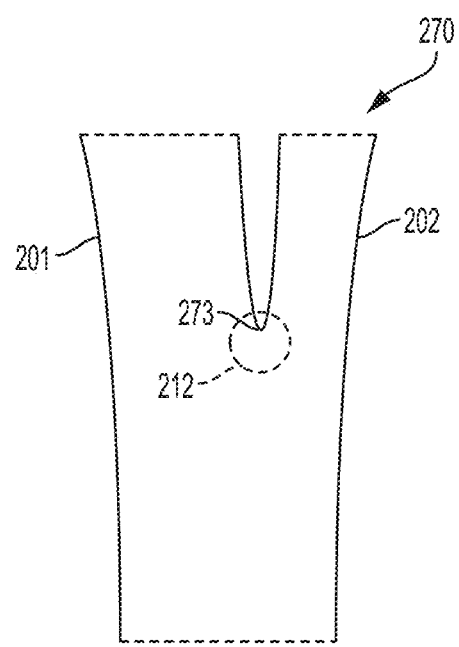
FIG. 2E illustrates a three-terminal device having a rounded feature at an intersection, according to some embodiments.

FIG. 2D illustrates the three-terminal device that includes an output port, according to some embodiments. The gate channel 201 may have a current source 268 connected thereto. The drain channel 202 may have a current generator 269 connected thereto. An output element 227, such an impedance, may have a terminal connected to the drain channel, and a terminal connected to reference terminal 221. In some embodiments, reference terminal 221 is held at the same potential as reference terminal 211, though the application is not limited in this respect.

There are several aspects about the device shown in FIG. 2D that are worth noting. In some embodiments, the current switching behavior may be controlled by current source 268. In this case, a reduction in current in the gate channel can switch current from the drain channel to the output element 227. In response, a voltage may arise across the terminals of output element 227. In other embodiments, the current switching behavior may be controlled by current source 269. In this case, an increase in current can switch current from the drain channel to the output element 227. In either case, by biasing the device near the switching point, a small change in applied current can result in a large current change at the output element 227.

Another aspect about the device is that the threshold for current switching can be reset dynamically by changing the amount of current density in the non-controlling channel. For example, if the gate channel is used to control current switching, a first current density may be applied to the drain channel in a first case so that the device switches at a first current level applied to the gate channel. At a later time, the current density applied to the drain channel may be changed to a second value, so that the device will switch at a second current level applied to the gate channel. This aspect can be understood from the discussion below in connection with FIG. 3B, though the drain channel is used to control switching for that discussion.

In other embodiments, the voltage that appears across the intersection region may be sensed by an external circuit (as depicted in FIG. 3A, for example) to obtain information about the current flowing in the gate channel. As described previously, the critical current is defined as the maximum current that can flow without forming a voltage state. FIGS. 3A-3B illustrate a method for determining the critical current associated with a drain channel of a three-terminal superconducting device 200. FIG. 3A illustrates three-terminal device 200 having a impedance connected thereto. Impedance 218 may represent, for example, the impedance of a scope or any other suitable measuring instrument. Impedance 218 may have one terminal connected between a current source 210 and a drain channel 202, and another terminal connected to a reference terminal 211. Gate channel 201 may be connected to a current source 215, which may be configured to output an electric current $I_G$. The current source 210 may be configured to output a time-dependent current $I_{in}(t)$. When $I_{in}(t)$ varies over time, the voltage $V_{out}(t)$ across the terminals of the impedance 218 may also vary over time.

FIG. 3B depicts two graphs, where the first graph illustrates $I_{in}(t)$ as a function of time and the second graph illustrates $V_{out}(t)$ as a function of time. In some embodiments, $I_{in}(t)$ may be swept linearly over time, as depicted by curve 310. As $I_{in}(t)$ is swept, $V_{out}(t)$ may be detected. Initially, the current $I_G$ generated by current source 212 may be equal to a value $I_{G1}$. Throughout the region labeled "R1", $V_{out}(t)$ may exhibit a voltage that is approximately zero (e.g., having an noise-free value that is less than 100 mV), due to the fact that the resistance, within the superconducting device, between current source 210 and reference terminal 211 is essentially zero. As $I_{in}(t)$ in increased, the imbalance between the current densities of the gate channel 201 and the drain channel 202 may also increase, thus causing the current to crowd in the intersection region 212.

When $I_{in}(t)$ reaches critical current $I_{C1}$, $V_{out}(t)$ may exhibit a sharp discontinuity, due to the fact that the resistance is greater than substantially zero. In some embodiments, when the critical current is reached, the current crowding in the intersection region 212 may break down superconductivity, which may lead to a departure from the superconducting state and may cause a hotspot to form. Further increases in $I_{in}(t)$ beyond $I_{C1}$ may cause $V_{out}(t)$ to increase linearly with a slope that depends on the value of the measureable resistance. Curve $318_1$ represents $V_{out}(t)$ when $I_G$ is equal to $I_{G2}$. In some embodiments, the current $I_{C1}$ can be inferred by detecting the current at which the voltage $V_{out}(t)$ exhibits a discontinuity.

Subsequently, $I_G$ may be increased to $I_{G2}$, where $I_{G2}$ is greater than $I_{G1}$, and the procedure to determine the critical current may be repeated. Because the current flowing in the gate channel may be greater than in the case described previously, the drain current needed to form current crowding in the intersection region may be larger, in some embodiments. Consequently, the critical current $I_{C2}$ may be larger than the critical current $I_{C1}$. As the current 310 is increased, $V_{out}(t)$ may be equal to approximately zero (e.g., having an noise-free value that is less than 1 mV) in the region labeled "R2". When the $I_{in}(t)$ reaches $I_{C2}$, curve $318_2$ may exhibit a discontinuity due to the fact that the resistance, within the superconducting device, between current source 210 and reference terminal 211 is measureable. By detecting the current at which $V_{out}(t)$ exhibits a discontinuity, the critical current $I_{C2}$ can be inferred.

Subsequently, $I_G$ may be increased to $I_{G3}$, where $I_{G3}$ may be greater than $I_{G2}$, and the procedure to determine the critical current may repeated. For reasons that can be appreciated from the description of the previous case, the critical current $I_{C3}$ may be greater than $I_{C2}$, and curve $318_3$ may exhibit a superconducting region "R3" that is greater than R2. The critical current may be proportional to the gate current $I_G$. In some embodiments, the critical current may be linearly proportional to the gate current $I_G$. The constant of proportionality may depend on various geometric factors, such as the angle defined by the gate and drain channels, the ratio $W_G/W_D$, the type of superconducting material from which the device is formed, the device thickness, etc. For example, the smaller the angle between the channels, the more sensitive the critical current to variations in the gate current. As another example, the larger the ratio $W_G/W_D$, the more sensitive the critical current to variations in the gate current.

In some embodiments, the procedure described in connection with FIGS. 3A-3B may be used to detect a current flowing in a superconducting channel without perturbing the superconducting state or amount of current flowing in the channel. It is desirable to detect a superconducting current flowing in a channel without perturbing it and without having to resort to complex magnetically coupling structures. Using a three-terminal superconducting device 200 according to the procedure described in connection with FIGS. 3A-3B may provide a way to detect a superconducting current without perturbing it. For example, the gate current $I_G$ may be inferred by detecting the critical current of a gate channel as described previously.

In some embodiments, a three-terminal superconducting device 200 may be configured to operate in a transistor mode, where an amount of current flowing in a gate channel 201 or in a drain channel 202 may be used control an amount of current flowing through an output port connected to the drain channel. For example, by varying the current in the gate channel or drain channel, a portion of the drain channel 202 may change between superconducting and normal states, which may change an amount of current flowing out an output port connected to the drain channel.

Figure 4A:
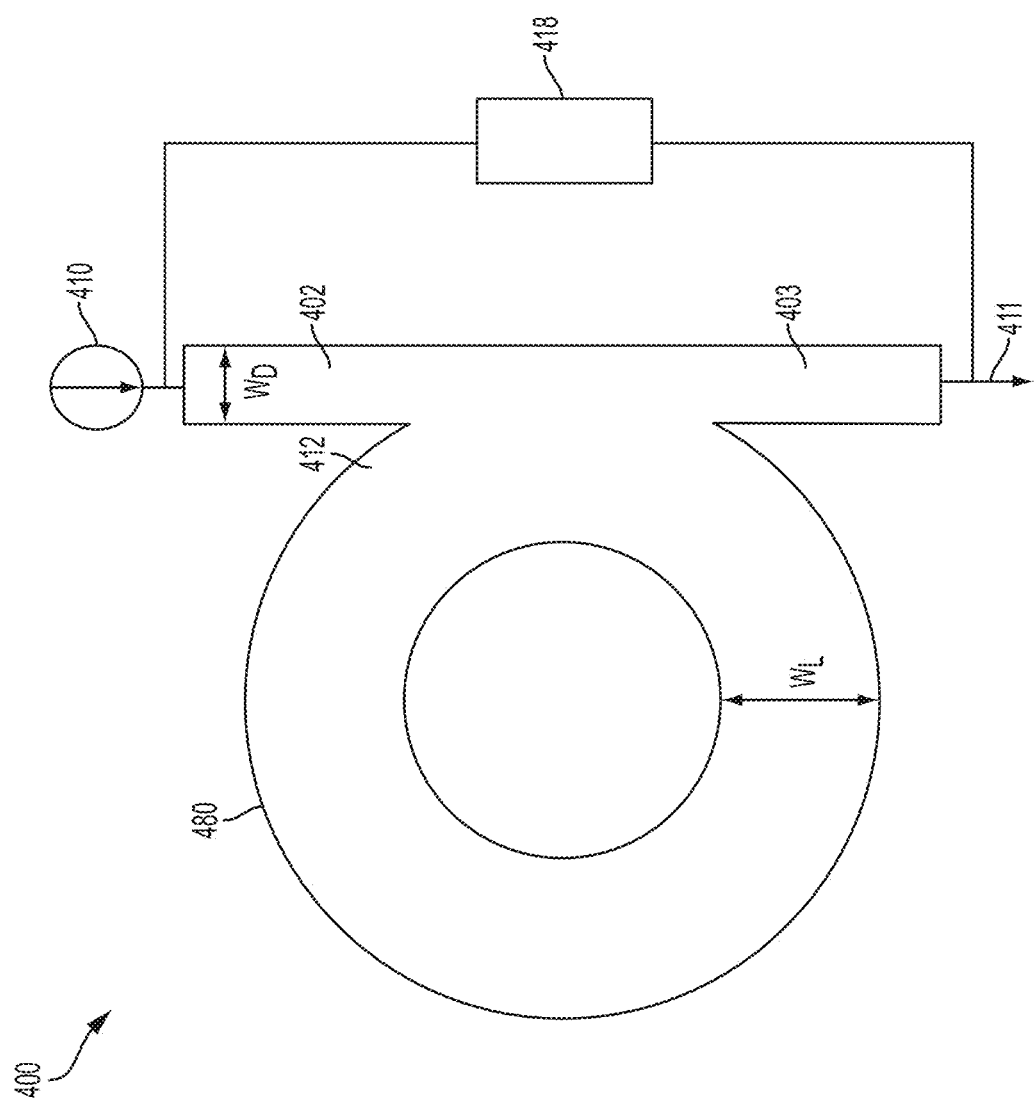
FIG. 4A illustrates a superconducting device comprising a loop, according to some embodiments.

In another example, a current flowing within a superconducting loop may be detected without having to disrupt the superconducting state of the loop. FIG. 4A illustrates a superconducting device 400 comprising a superconducting loop 480, according to some embodiments. Superconducting loop 480 may be formed by patterning a superconducting material with a donut-like shape. When cooled below its critical temperature, superconducting loop 480 may be configured to store energy in the magnetic field created by an electric current (via magnetic inductance) circulating in the loop and/or the inertial motion of the electronic charge carriers (via kinetic inductance). In some embodiments, when the loop is in a superconducting state, the currents may circulate essentially indefinitely. In some embodiments, a current circulating in the loop may be quantized, and the magnetic flux created by the circulating current may also be quantized. The term "fluxon" is used herein to refer to a quantum (or quant) of flux associated with the loop.

As illustrated in FIG. 4A, a superconducting loop 480 may be connected to a superconducting channel 402. One end of an input channel 402 may be connected in series to a current source 410 and an end of an output channel 403 may be connected to a reference terminal 411. Reference terminal 411 may be held at a fixed potential. In some embodiments, there may be an abrupt feature, or a rounded feature, between the input channel 402 and a superconducting loop 480 at an intersection region 412. An impedance 418 may be connected in parallel with the input and output channels, such that one terminal of the impedance is connected between current source 410 and channel 402 and the other terminal of the impedance is connected to a reference terminal 411.

In some embodiments, a superconducting device 400 may be configured to detect a current circulating within superconducting loop 480 without perturbing the state of the superconducting loop. In some embodiments, a superconducting loop may have a width $W_L$, that may be greater than the superconducting coherence length associated with the material from which the loop is formed. The width $W_L$ may be between 50 nm and 800 nm in some embodiments, between 100 nm and 300 nm in some embodiments, or between 150 nm and 250 nm in some embodiments, though larger values may be used in some cases and for different materials. A channel 402 may have a width $W_D$ that is greater than the superconducting coherence length associated with the material from which the channel is formed. The width $W_D$ may be between 50 nm and 800 nm in some embodiments, between 50 nm and 300 nm in some embodiments, or between 50 nm and 150 nm in some embodiments, though larger values may be used in some cases and for different materials. In some embodiments, the loop may be wider than the channel, and $W_L$ may have a ratio to $W_D$ that is between 1:1 and 8:1 in some embodiments, between 1:1 and 5:1 in some embodiments, between 1:1 and 3:1 in some embodiments, or between 1:1 and 2:1 in some embodiments, though different ratios may be implemented in some cases.

A superconducting loop 480 may act similarly to a gate channel 201 of FIG. 2A, if, for example, currents circulating clockwise within the superconducting loop are considered. In some embodiments, a current circulating in the loop may be inferred by detecting the critical current of the channel 402. A critical current may be detected by sweeping the current generated by current source 410, and by detecting the current at which the sensed voltage across the impedance 418 exhibits a discontinuity. In some embodiments, a discontinuity in the sensed voltage may be caused by a hot spot formed in response to a current crowding in the intersection region 412.

Figure 4B:
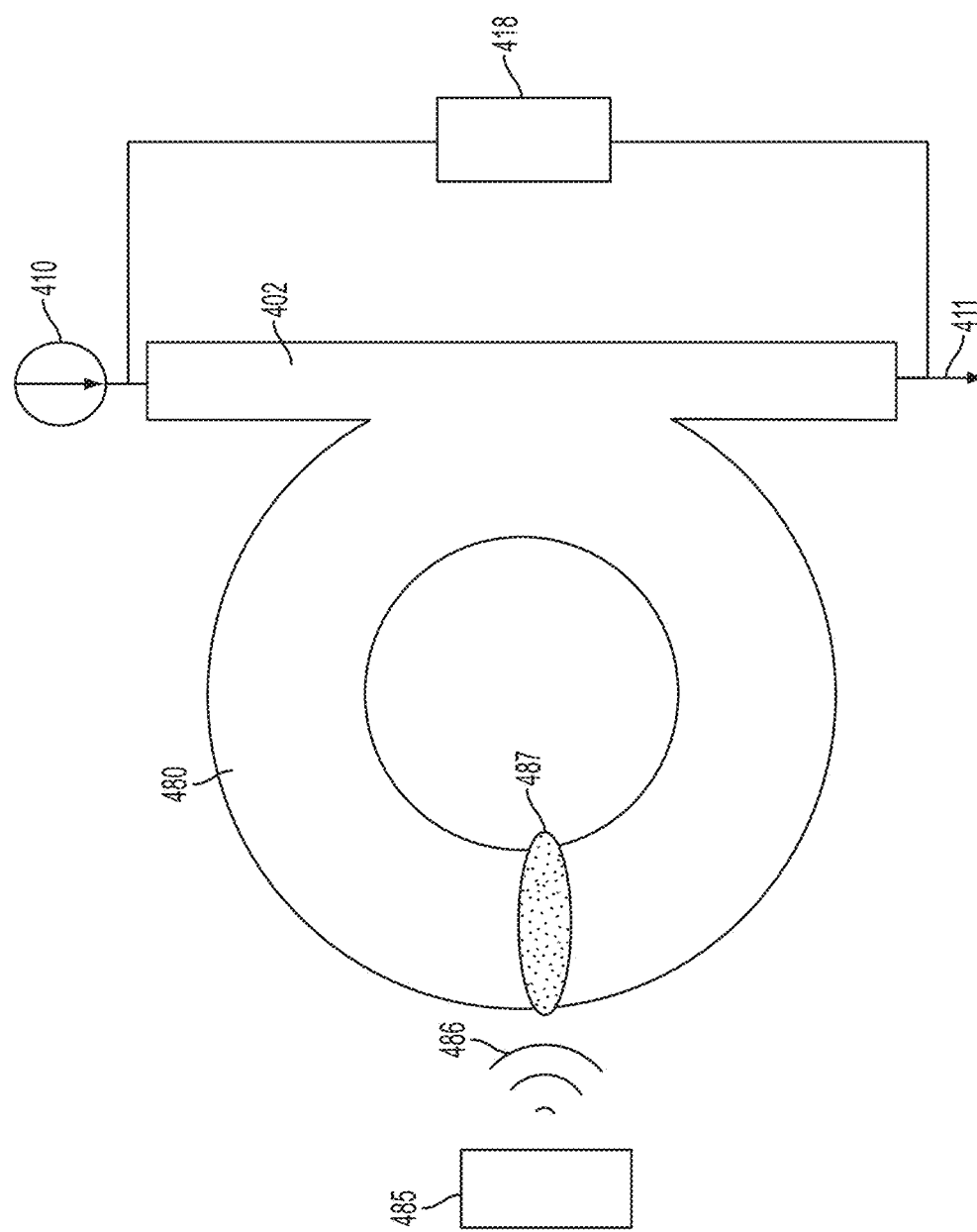
FIG. 4B illustrates the superconducting device of FIG. 4A, wherein the loop comprises a resistive portion, according to some embodiments.

FIG. 4B illustrates a superconducting device 400 having a heating element 485 thermally coupled to the loop. The heating element may be used to change a number of fluxons trapped by the superconducting loop 480. The heating element may comprise, for example, a resistive element configured to heat up as an electric current flows across its terminals. However, any other suitable heating element configured to emit heat may be used. In some embodiments, a heating element 485 may be configured to radiate heat 486 toward the superconducting loop 480. The radiated heat may elevate the temperature of a portion of the loop 480 and create a resistive portion 487 extending between the center of the loop and the region surrounding the loop. The appearance of a resistive portion can temporarily break the superconductivity of the loop. Such a resistive portion may, in some embodiments, allow one or more fluxons trapped by the superconducting loop to escape or allow one or more fluxons to be added to the superconducting loop. In some embodiments, fluxons in the loop may be added and/or removed by coupling a magnetic field to the loop. Alternatively, or additionally, fluxons in the loop may be added and/or removed by injecting current in the loop.

Aspects of the present application provide a method of storing and sensing an amount of fluxons retained by a superconducting loop. In some embodiments, a method may comprise heating up and cooling down a superconducting loop to change a number of fluxons retained by a superconducting loop 480. A method may further comprise detecting a critical current associated with the loop to infer a number of fluxons retained by the loop. Without being bound to any particular theory, a number N of fluxons retained by a superconducting loop and the current L circulating in the superconducting loop may be proportional to one another according to the following expression $$N\Phi = LI_n$$

where $\Phi$ is a quantum of magnetic flux associated with a single fluxon, and L is the inductance of the current loop 480. This expression indicates that the current $I_n$ circulating in a superconducting loop can be quantized.

Figure 4C:
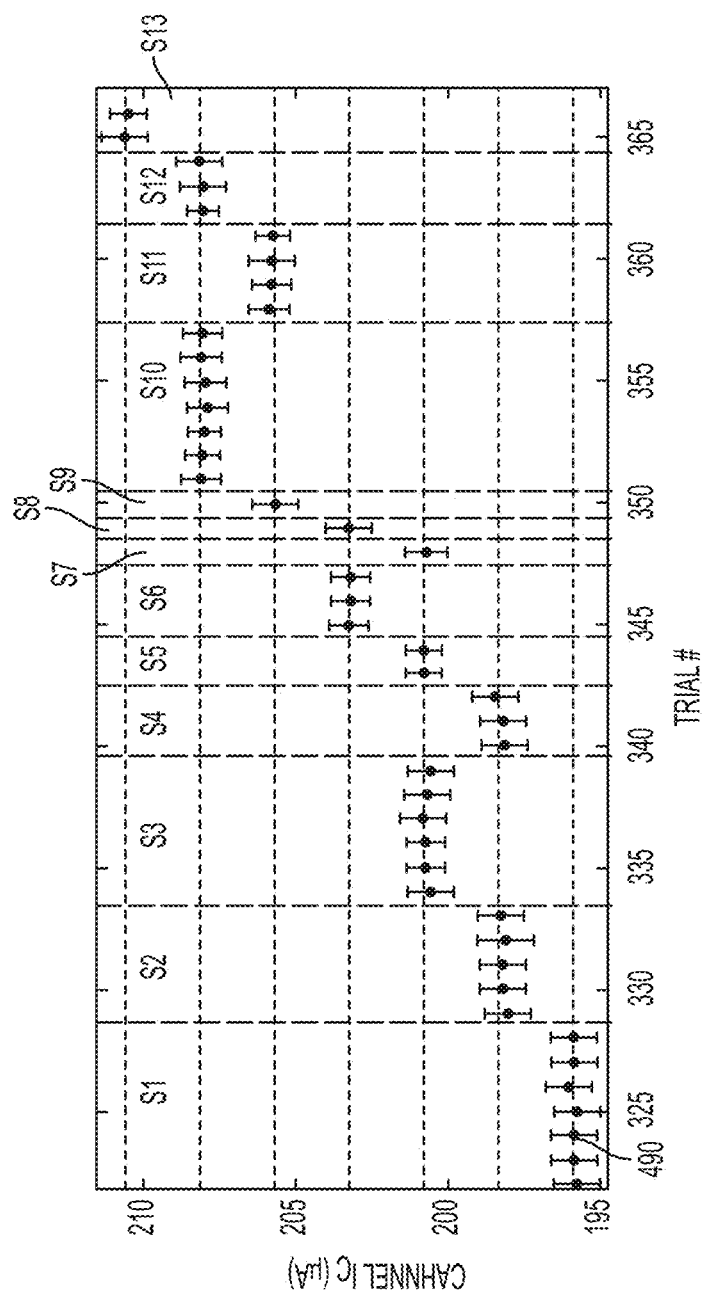
FIG. 4C is a graph illustrating values of a critical current measured for the device of FIG. 4A over a number of trials, according to some embodiments.

The graph of FIG. 4C plots 45 values of critical currents that were measured separately for a fluxon storage device like that depicted in FIG. 4A. Measurements of the critical current can be used to infer an amount of fluxons stored in the superconducting loop, without perturbing the superconducting state of the loop 480. Each data point on the graph, such as data point 490, represents the median of 100 measurements of the critical current for a superconducting device 400 storing a plurality of fluxons. Each set of error bars on each point correspond to the standard deviation of those 100 measurements. The critical current may be measured according to the method described in connection with FIG. 4A, for example. The graph is divided into thirteen sets of measurements, identified as S1, S2, S3, . . . S13. Within each set there may be one or more measurements of critical current $I_C$. Between each point like data point 490, the loop was heated and the superconducting loop was allowed to add a single fluxon, remove a single fluxon, or keep the same number of fluxons. Within this set, the repeated measurement of the same critical current indicates that the measurement does not perturb the superconducting state and the number of fluxons retained by the loop. Only when the loop was heated and the superconductivity disrupted by that heat (e.g. between S1 and S2) did the number of fluxons retained by the loop change.

In between the sets of measurements, the superconducting loop's current may be perturbed by creating a resistive portion within the superconducting loop as illustrated in FIG. 4B. Creating a resistive portion may change the state of the superconducting loop. Subsequently, when the loop is placed back into a superconducting state, a new current may circulate within the loop. The new current may be different from, or equal to, the previous current and retain a different or same number of fluxons. From the data of FIG. 4C, it may be determined that the sensed critical current $I_C$ for the device is quantized in minimum increments of approximately 2.48 µA. Accordingly, the state of the superconducting loop corresponding to set S1 stores approximately 79 fluxons, and the state corresponding to set S13 stores approximately 85 fluxons. Different device designs (e.g., different loop and channel dimensions) may have different values for the minimum current increments.

According to some aspects, a superconducting device 400 may be used as a multi-state, digital memory element. For example, a superconducting loop may be configured to store any integer number, including zero) of fluxons therein that are permitted by the superconducting loop. Each state of stored fluxons may correspond to a discrete datum. In some embodiments, the content of the memory element may be inferred by detecting a critical current associated with the superconducting loop, as described in connection with FIG. 4C. In some embodiments, the memory element may be written by breaking superconductivity of the loop 480, exciting a desired current level within the loop, and restoring superconductivity of the loop. The inventors have recognized and appreciated that the rate at which data can be written to a superconducting memory element of the present embodiments can be as high as 400 GHz. Because a superconducting current loop can store a plurality of fluxons, a single loop can provide significantly more data storage than a conventional binary storage element.

Figure 5:
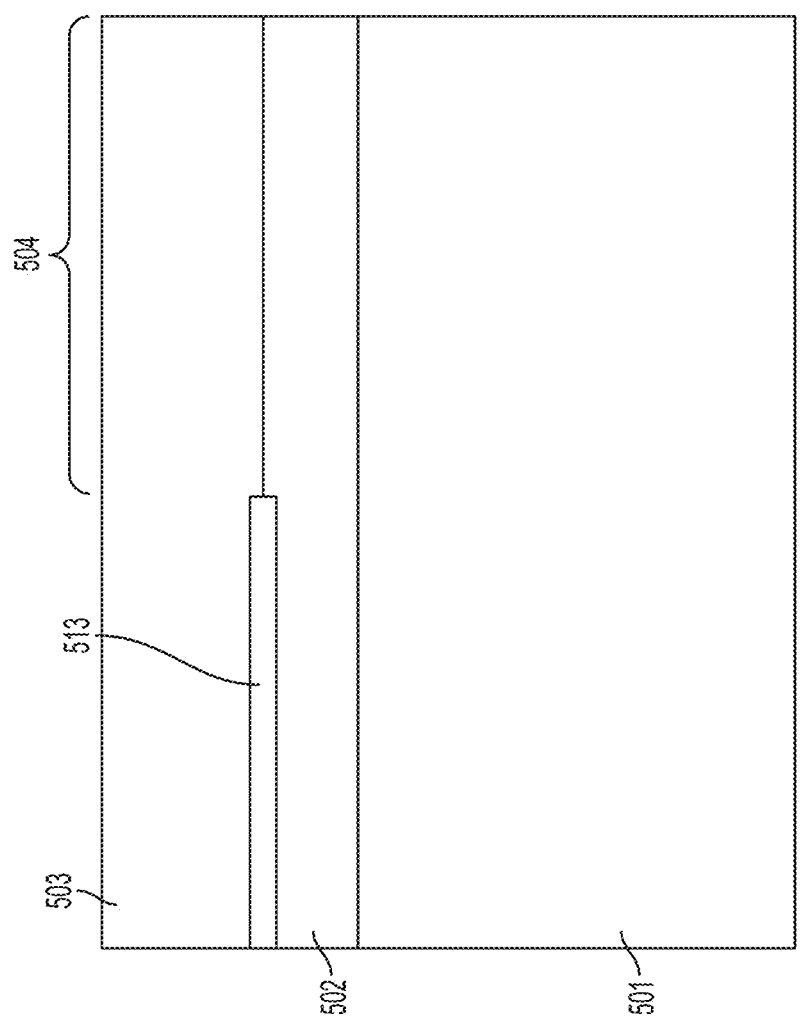
FIG. 5 is a cross sectional view of a superconducting device comprising substrate and at least two layers of superconducting material, according to some embodiments.

In some implementations, a three-terminal superconducting device may be fabricated by depositing a plurality of layers on a substrate. FIG. 5 is a cross sectional view of a three-terminal superconducting device 500 comprising a substrate 501 and at least two layers of superconducting material, according to some embodiments. The substrate 501 may comprise any suitable type of substrate, such as a silicon substrate, a silicon oxide substrate, a silicon nitride substrate, a glass substrate, a polymer substrate, etc. The superconductor layer 502 may be deposited, or otherwise formed, on top of the substrate 501 and may comprise any suitable superconducting material such as niobium (Nb), niobium nitride (NbN), niobium monoxide (NbO), tantalum (Ta), technetium (Tc), titanium nitride (TiN), niobium titanium nitride (NbTiN), yttrium barium copper oxide (YBCO), etc. The superconducting layer 502 may serve as a gate channel or a drain channel in a three-terminal superconducting device of the type described herein. The thickness of the superconducting layer 502 may be between 50 nm and 800 nm in some embodiments, between 100 nm and 300 nm in some embodiments, or between 150 nm and 250 nm in some embodiments, though other values of thickness may be implemented in some embodiments.

A three-terminal superconducting device 500 may further comprise an insulating layer 513, disposed on superconducting layer 502. The insulating layer 513 may comprise any suitable type of insulating material, such silicon oxide, silicon nitride, silicon oxynitride, aluminum oxide, titanium oxide, etc. The thickness of the insulating layer 513 may be between 2 nm and 50 nm in some embodiments, between 2 nm and 20 nm in some embodiments, or between 5 nm and 20 nm in some embodiments, though other values of thickness may be implemented in some embodiments. The insulating layer 513 may be patterned to cover only a portion of the superconducting layer 502, as illustrated in FIG. 5.

A three-terminal superconducting device 500 may further comprise a second superconducting layer 503, deposited on top of the insulating layer 513. The superconducting layer 503 may serve as a gate channel or a drain channel, and may be formed from any suitable superconducting material. In some embodiments, superconducting layers 503 and 502 may be formed from the same superconducting material. However the application is not limited in this respect, and different superconducting materials may be used. The thickness of superconducting layer 502 may be between 50 nm and 800 nm in some embodiments, between 100 nm and 300 nm in some embodiments, or between 150 nm and 250 nm in some embodiments, though other values of thickness may be implemented in some embodiments.

The ratio of the thickness of superconducting layer 502 to the thickness of superconducting layer 503 may be between 1:8 and 8:1 in some embodiments. Three-terminal superconducting device 500 may serve as three-terminal superconducting device 200 of FIG. 2A, where the portion 504 of the stack formed by superconducting layers 502 and 503 may serve as reference channel 203. In some embodiments, the gate channel may be configured to support an electric current flowing toward the reference channel, and the drain channel may be configured to support an electric current flowing toward the reference channel. As described in connection with FIGS. 2A-2C, current crowding in the region proximal the end 512 of insulating layer 513 may arise when the current densities are unbalanced.

Figure 6:
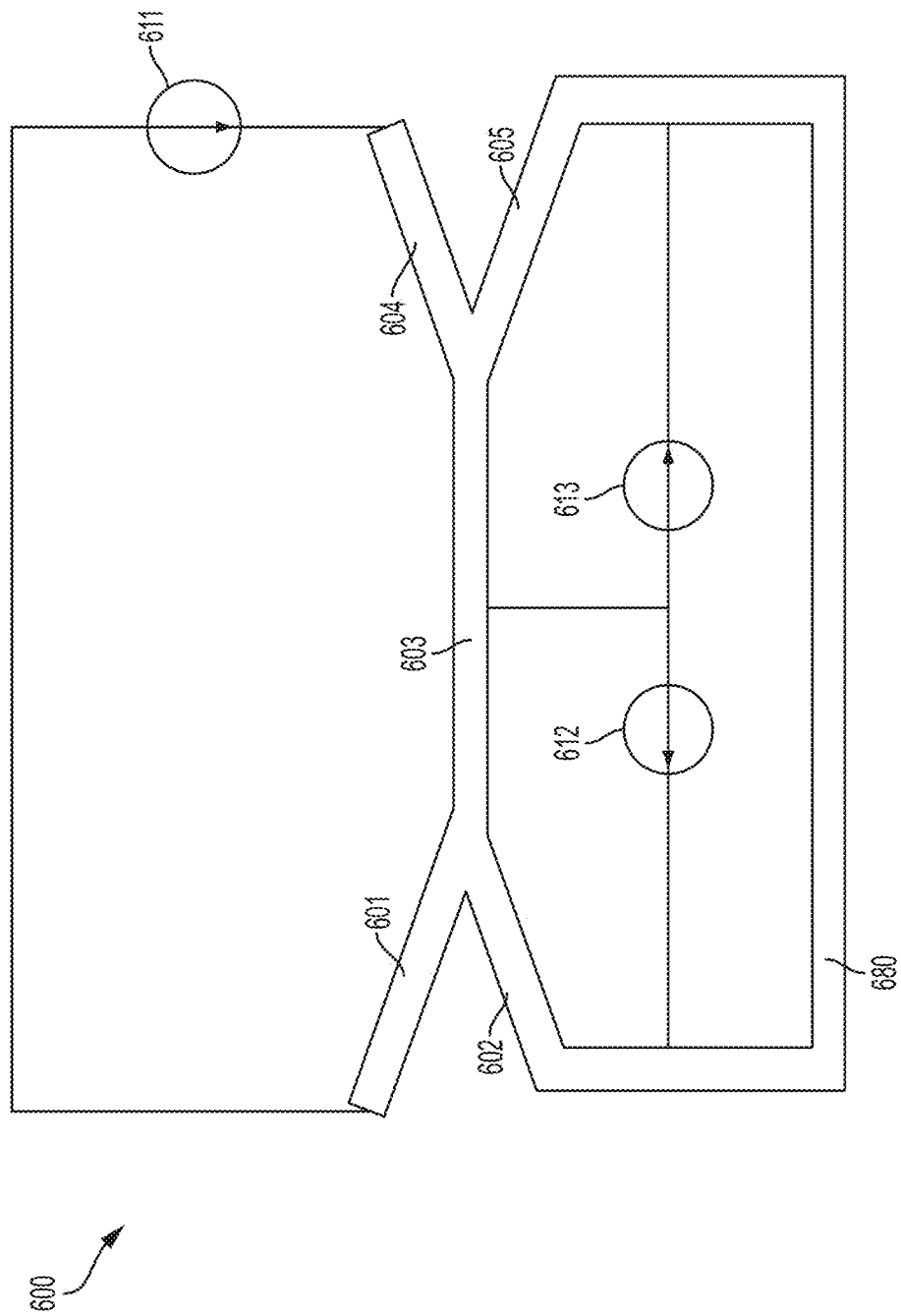
FIG. 6 illustrates a device having at least two three-terminal superconducting devices, according to some embodiments.

According to some embodiments, a superconducting device using three-terminal devices of the type described herein may be used to form superconducting logic circuitry, such as logical AND and XOR gates. FIG. 6 illustrates a superconducting device that may be used with additional three-terminal devices to form logic circuity, according to some embodiments. A superconducting device 600 may comprise a first gate channel 601, a second gate channel 604, a reference channel 603, a first drain channel 602, a second drain channel 605 and a superconducting shunt 680 that connects the two drain channels. Each of these components may be formed from a superconducting material. In some embodiments, the gate, drain, reference and shunt components may be formed from a single superconducting material (e.g., patterned in a single layer of superconducting material). However, the application is not limited in this respect and multiple superconducting materials may be used for the various components of superconducting device 600.

In some embodiments, gate channel 601 may intersect drain channel 602 at an angle. The angle may be between 90° and 0° in some embodiments, between 70° and 0° in some embodiments, between 30° and 0° in some embodiments, between 10° and 0° in some embodiments, or between 5° and 0° in some embodiments, though other values for the angle may be implemented in some embodiments. Gate channel 601, drain channel 602 and reference channel 603 may form a three-terminal superconducting device, such as the three-terminal superconducting device described in connection with FIG. 2A-2C. A sharp feature may be located at the intersection region as described above in connection with FIG. 2E.

In some embodiments, gate channel 604 may intersect drain channel 605 at an angle. The angle may be between 90° and 0° in some embodiments, between 70° and 0° in some embodiments, between 30° and 0° in some embodiments, between 10° and 0° in some embodiments, or between 5° and 0° in some embodiments, though other values for the angle may be implemented in some embodiments. Gate channel 604, drain channel 605 and reference channel 603 may form a three-terminal superconducting device, such as the three-terminal superconducting device described in connection with FIG. 2A-2C. A sharp feature may be located at the intersection region as described above in connection with FIG. 2E.

The drain channels and the gate channels may have widths that are greater than the superconducting coherence length associated with the material from which the respective channels are formed. The widths may be between 50 nm and 800 nm in some embodiments, between 50 nm and 300 nm in some embodiments, or between 50 nm and 150 nm in some embodiments, though other values of the width may be used in some embodiments. In some embodiments, the gate channel may be wider than the corresponding drain channel, and gate channel's width may have a ratio to the drain channel's width that is between 1:1 and 8:1 in some embodiments, between 1:1 and 5:1 in some embodiments, between 1:1 and 3:1 in some embodiments, or between 1:1 and 2:1 in some embodiments, though other values of the width may be used in some embodiments. Reference channel 603 may have a width that is greater than or equal to the sum of the gate channel's width and the drain channel's width.

In some embodiments, gate channel 604 may be connected to one terminal of current source 611. The other terminal of current source 611 may be connected to gate channel 601 via normal state conductors. In some embodiments, superconducting device 600 may further comprise current sources 612 and 613, connected via normal conductors between the reference channel 603 and the shunt 680. Current sources 612 and 613 may be disposed in parallel to drain channels 602 and 605 respectively, as illustrated in FIG. 6. In some embodiments, the currents provided by current sources 612 and 613 may be approximately equal. In some embodiments, current source 611 may be used to control the operation of superconducting device 600, whereas current sources 612 and 613 may be configured to output constant electric currents that can boost an amount of current flowing through the shunt 680. However, the application is not limited in this respect and other configurations may be used. For example, the current sources 612 and 613 may be replaced with a single current source connected between a mid-point of the reference channel 603 and a mid-point of the shunt 680, in some cases.

In operation and for some circumstances, current source 611 may be operated to provide a current directed toward gate channel 604. In such a case, if the current provided by current source 613 is such that current densities in gate channel 604 and drain 605 are approximately balanced, there will be no voltage state at the intersection of gate 604 and drain 605 channels. Accordingly, a current may rotate clockwise in the loop comprising normal state conductors, current source 611, and superconducting reference channel 603. Because of the direction of current flow through reference channel 603, a hot spot may form in drain channel 602. Therefore, current from source 612 may flow through shunt 680 in a counterclockwise direction.

Contrarily, if the current source 611 is operated to reverse the flow of current in channel 604, the flow of current through reference channel 630 and shunt 680 will both reverse. Additionally, the hot spot will switch from drain 602 to drain 605.

Superconducting device 600 may be used as a building block for logic circuitry, according to some embodiments. For example, a superconducting drain channel and controllable current source may be added to shunt 680 to form a superconducting logical AND gate. For an AND gate, the added drain channel should branch from the shunt in a direction such that current flowing from the added source would oppose the direction of current flowing in the shunt due to current source 611. The added drain channel and added current source essentially form another three-terminal superconducting device with the shunt 680 acting as a drain and reference channel. Current from the added drain source would only be diverted to an output port connected to the added drain channel when current source 611 and the added current source apply current to their respective drain channels.

In another embodiment, an exclusive OR gate may be formed by adding a drain channel and current source to the shunt 680 of the superconducting device 600 such that the added drain channel branches from the shunt in a direction such that current flowing from the added source would follow the direction of current flowing in the shunt due to current source 611.

In some embodiments, two or more superconducting devices 600 may be cascaded to form additional superconducting logic circuitry.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, system upgrade, and/or method described herein. In addition, any combination of two or more such features, systems, and/or methods, if such features, systems, system upgrade, and/or methods are not mutually inconsistent, is included within the inventive scope of the present disclosure.

The terms "about," "approximately," and "substantially" may be used to refer to a value, and are intended to encompass the referenced value plus and minus variations that would be insubstantial. The amount of variation could be less than 5% in some embodiments, less than 10% in some embodiments, and yet less than 20% in some embodiments. In embodiments where an apparatus may function properly over a large range of values, e.g., one or more orders of magnitude, the amount of variation could be as much as a factor of two. For example, if an apparatus functions properly for a value ranging from 20 to 350, "approximately 80" may encompass values between 40 and 160.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

The invention claimed is:

1. A device comprising:
an input channel;
an output channel connected to the input channel;
a conductive loop formed from a material that supports superconductivity and connected to both the input channel and the output channel, wherein the conductive loop and the input channel form an intersection region; and
a heating element thermally coupled to the conductive loop.

2. The device of claim 1, further comprising a sharp feature having an acute angle and protruding into the intersection region.

3. The device of claim 2, wherein the acute angle is between 0 degrees and 70 degrees.

4. The device of claim 1, wherein a measurable resistance having a value between 10 ohms and 1000 ohms forms in the input channel adjacent to the intersection region when the device is operated in a superconducting state and an imbalance in current density that is greater than a threshold value is applied between the input channel and the conductive loop.

5. The device of claim 1, wherein superconductivity is suppressed in the input channel adjacent to the intersection region allowing flux to flow across the input channel when the device is operated in a superconducting state and an imbalance in current density that is greater than a threshold value is applied between the input channel and the conductive loop.

6. The device of claim 1, further comprising a sensing terminal connected to the input channel for sensing a voltage difference between the input channel and the output channel.

7. The device of claim 1, further comprising a controllable current source connected to the input channel.

8. The device of claim 1, wherein the input channel, the output channel, and the conductive loop have thicknesses that are less than a superconducting penetration depth associated with the material.

9. The device of claim 1, wherein the input channel and the conductive loop have widths greater than a superconducting coherence length associated with the material.

10. The device of claim 1, wherein a ratio of a width of the conductive loop to a width of the input channel is between 1:1 and 8:1.

11. The device of claim 1, wherein the input channel, the output channel, and the conductive loop are formed from the material.

12. The device of claim 1, wherein the input channel, the output channel, and the conductive loop are disposed on a surface of a substrate.

13. A device comprising:
an input channel;
an output channel connected to the input channel; and
a conductive loop formed from a material that supports superconductivity and connected to both the input channel and the output channel, wherein:
the conductive loop and the input channel form an intersection region, and
a reduction in current in the input channel, when the device is operated in a superconducting mode, increases current crowding at the intersection region and causes the formation of measurable resistance in a portion of the input channel.

14. The device of claim 13, further comprising a sharp feature having an acute angle and protruding into the intersection region.

15. The device of claim 13, wherein the measurable resistance, when formed, has a value between 10 ohms and 1000 ohms.

16. The device of claim 13, wherein the conductive loop, the input channel, and the output channel have thicknesses that are less than a superconducting penetration depth associated with the material.

17. The device of claim 13, wherein a ratio of a width of the conductive loop to a width of the input channel is between 1:1 and 8:1.

* * * * *

UNITED STATES PATENT AND TRADEMARK OFFICE
CERTIFICATE OF CORRECTION

PATENT NO. : 11,329,211 B2  
APPLICATION NO. : 16/992458  
DATED : May 10, 2022  
INVENTOR(S) : Adam N. McCaughan et al.

It is certified that error appears in the above-identified patent and that said Letters Patent is hereby corrected as shown below:

On the Title Page

Item (63) Related U.S. Application Data:
"Continuation of application No. 15/563,158, filed as application No. PCT/US2016/025710 on Apr. 1, 2016, now Pat. No. 10,749,097"

Should Read:
-- Continuation of application No. 15/563,158, filed on Sep. 29, 2017, now Pat. No. 10,749,097, filed as application No. PCT/US16/25710 on Apr. 1, 2016. --

In the Specification

At Column 1, Line 22:
"This invention was made with Government support under Contract No. W911NF-14-C-0089 awarded by the Army Research Office, and Grant No. FA9550-14-1-0052 awarded by the Air Force Office of Scientific Research. The Government has certain rights in the invention."

Should Read:
-- This invention was made with government support under FA9550-14-1-0052 awarded by the Air Force Office of Scientific Research and W911NF-14-C-0089 awarded by the Army Research Office. The government has certain rights in the invention. --

Signed and Sealed this  
Twenty-seventh Day of December, 2022

Katherine Kelly Vidal  
*Director of the United States Patent and Trademark Office*